(12) United States Patent
Laprade et al.

(10) Patent No.: US 7,770,087 B2
(45) Date of Patent: Aug. 3, 2010

(54) SERIAL CONCATENATED CONVOLUTIONAL CODE DECODER

(75) Inventors: Maria Laprade, Palm Bay, FL (US); Matthew C. Cobb, West Melbourne, FL (US); Timothy F. Dyson, Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 867 days.

(21) Appl. No.: 11/624,904

(22) Filed: Jan. 19, 2007

(65) Prior Publication Data

US 2008/0177895 A1    Jul. 24, 2008

(51) Int. Cl.
*H03M 13/00*     (2006.01)
(52) U.S. Cl. ..................... 714/755; 714/758
(58) Field of Classification Search ........... 714/755, 714/758, 752, 786, 75
See application file for complete search history.

(56) References Cited

U.S. PATENT DOCUMENTS

| | | | | |
|---|---|---|---|---|
| 6,029,264 | A * | 2/2000 | Kobayashi et al. | 714/755 |
| 6,983,412 | B2 | 1/2006 | Fukumasa | |
| 7,093,179 | B2 * | 8/2006 | Shea | 714/755 |
| 2002/0029364 | A1 * | 3/2002 | Edmonston et al. | 714/755 |
| 2005/0229087 | A1 * | 10/2005 | Kim et al. | 714/800 |

OTHER PUBLICATIONS

Benedetto, et al., "A Soft-Input Soft-Output APP Module for Iterative Decoding of Concatenated Codes," IEEE Comm. Letters, vol. 1, No. 1, Jan. 1997 pp. 22-24.

Benedetto, et al., "Serial Concatenation of Interleaved Codes: Performance Analysis, Design, and Iterative Decoding," IEEE Transactions on Information Theory, vol. 44, No. 3, May 1988, pp. 909-926.
Garello, et al., "Computing the Free Distance of Turbo Codes and Serially Concatenated Codes with Interleavers: Algorithms and Applications," IEEE JnI on Selected Areas in Communications, vol. 19, No. 5, May 2001, pp. 800-812.
Bosco, et al., "A New Algorithm for 'Hard' Iterative Decoding of Concatenated Codes," IEEE Transactions on Communications, vol. 51, No. 8, Aug. 2003, pp. 1229-1232.
Benedetto, et al., "Serial Concatenation of Block and Convolutional Codes," Electronics Letters, May 9, 1996, vol. 32, No. 10, pp. 887-888.
Benedetto, et al., "Iterative decoding of serially concatenated convolutional codes," Electronics Letters, Jun. 20, 1996, vol. 32, No. 13, pp. 1186-1188.

(Continued)

*Primary Examiner*—Sam Rizk
(74) *Attorney, Agent, or Firm*—Fox Rothschild, LLP; Robert J. Sacco

(57) ABSTRACT

A serial concatenated convolutional code (SCCC) decoder is provided. The SCCC decoder is comprised of an input buffer memory (102), one or more processing loop modules (120), and an output buffer memory (112). Each processing loop module is comprised of a permutation module (110), an inner decoder module (104), a depermutation module (106), and an outer decoder module (108). The inner decoder module is subdivided into two (2) or more inner decoding engines ($202_1$-$202_N$) configured for concurrently performing a decoding operation based on an inner convolutional code. The outer decoder module is subdivided into two (2) or more outer decoding engines ($402_1$-$402_N$) configured for concurrently performing a decoding operation based on an outer convolutional code. The inner convolutional code and the outer convolutional code are designed in accordance with a maximum aposteriori probability based decoding algorithm.

27 Claims, 10 Drawing Sheets

OTHER PUBLICATIONS

Benedetto, et al., "Concatenated codes with interleaver for digital transmission over mobile channels," IEEE International Conference on Communications, 2001. ICC 2001, ICC 2001. Jun. 11-14, 2001, pp. 3026-3030, vol. 10.

Scanavino, et al., "Convergance properties of iterative decoders working at bit and symbol level," Global Telecommunications Conference, 2001, IEEE vol. 2, Nov. 25-29, 2001, pp. 1037-1041.

Benedetto, et al., "On the Design of Binary Serially Concatenated Convolutional Codes," Communication Theory Mini-Conference, Jun. 6-10, 1999, pp. 32-36.

Benedetto et al., "Serial Concatenated Trellis Coded Modulation with Iterative Decoding," Proceedings, 1997, IEEE International Symposium on Information Theory. Jun. 29-Jul. 4, 1997, p. 8.

Benedetto, et al., "Serial concatenation of interleaved codes: performance analysis, design and iterative decoding," IEEE International Symposium on Information Theory, 1997 Proceedings. p. 106.

Benedetto, et al., "Serial concatenation of interleaved codes: analytical performance bounds," Global Telecommunications Conf., 1996. "Communications: The Key to Global Prosperity," vol. 1, Nov. 18-22, 1996, pp. 106-110.

Chandran, "MAP Algorithm FAQ," found on the WWW at <<http://www.ittc.ku.edu/~rvc/projects/faq/map.htm>> printed on Feb. 5, 2007.

* cited by examiner

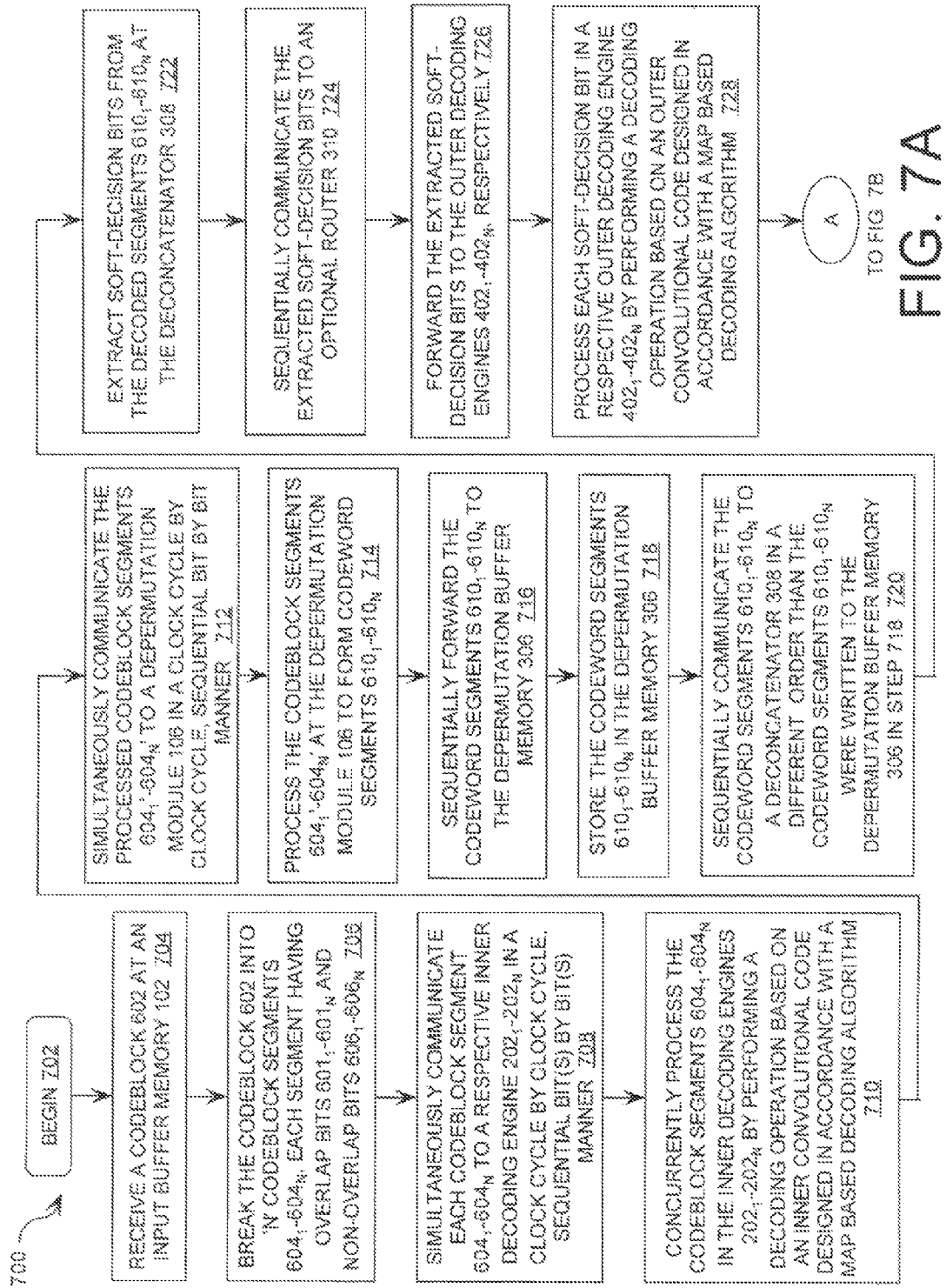

SERIAL CONCATENATED CONVOLUTIONAL CODE DECODER

STATEMENT REGARDING FEDERALLY SPONSORED RESEARCH OR DEVELOPMENT

This invention was made with Government support Contract No. FA8808-04-C-0022. The Government has certain rights in this invention as specified in FAR 52.227-12.

BACKGROUND OF THE INVENTION

1. Statement of the Technical Field

The inventive arrangements relate to digital communication equipment using an error correction technique. More particularly, the inventive arrangements relate to a serial concatenated convolutional code decoder.

2. Description of the Related Art

A serially concatenated convolutional code (SCCC) decoder provides a means for recovering information bits from a codeword. A codeword is often comprised of a bitstream that has been encoded using a forward error correction (FEC) technique based on at least one convolutional code. A codeword may be a relatively large sequence of information bits (for example, a few thousand information bits) to provide a high recoverability of encoded information contained therein.

One algorithm that is conventionally used in SCCC decoders for decoding coded sequences is the MAP algorithm, MAP is an acronym for the phrase "Maximum Aposteriori Probability." The MAP algorithm provides a method for determining the most probable information bits which were transmitted based on a noisy signal received over a communication channel. It is know in the art that the MAP algorithm is an inherently Soft-Input, Soft-Output (SISO) algorithm. Soft information refers to soft-values (which are represented by soft-decision bits) that comprise information about the bits, contained in a coded sequence. In particular, soft-values are values that represent the probability that a particular bit in a coded sequence is either a one (1) or a zero (0). For example, a soft-value for a particular bit can indicate that a probability of a bit being a one (1) is p(1)=0.3. Conversely, the same bit can have a probability of being a zero (0) which is p(0)=0.7. The most commonly used soft values are log-likelihood ratios (LLR's), An LLR which is a positive value suggests that the bit is most likely to he a one (1) whereas a negative LLR suggests that the value of the bit is most likely a zero (0). MAP algorithms are described in more detail in the following internet publication.

It is known that soft values can be used in SCCC devices for decoding concatenated codes. In general, concatenated codes use two codes (an inner code and an outer code) with some interleaving between them. Accordingly, SCCC decoders are commonly implemented with two separate decoders that are each utilizing MAP algorithms for the decoding process. An inner decoder decodes the inner code and an outer decoder decodes the outer code. The decoders are commonly configured for operation in an iterative process where the outputs of one decoder are repeatedly communicated to the other decoder. Since the MAP algorithm is a SISO type algorithm, the soft-values (represented by soft decision bits) generated by the MAP algorithm in one decoder can be used as inputs to the MAP algorithm in the other decoder.

During a first iteration of a concatenated code, an inner decoder processes soft-value approximations to bits output from an inner encoder. As a result of this processing, the inner decoder outputs soft-value approximations to the bits that were input to the inner encoder in an encoding process. Similarly, the outer decoder uses soft-value approximations to bits output from an outer encoder. Since the bits output from the outer encoder were permuted or interleaved (as explained in the preceding paragraph), the soft-value approximations are derived by applying a reverse permutation to the soft-value approximations output from the inner decoder prior to being communicated to the outer decoder. This reverse permutation is known in the art as depermutation. The outer decoder can produce two different outputs. One is a soft-value approximation to data that was input to the outer encoder. This data is the original, unencoded data, and is not of interest till a final iteration. This data need not be permuted or depermuted. The other output of the outer decoder is a refinement to soft-value approximations to bits output from an outer encoder. This output is interleaved (i.e., re-arranged) in the same manner as an encoder permuted output bits of the outer encoder prior to communicating the bits to the inner encoder. These permuted soft-value approximation outputs from the outer decoder approximate the bits input to the inner encoder and can therefore be used in a second iteration of the decoding process.

During the second iteration of the decoding process, the permuted soft-value approximation outputs are communicated to the inner decoder. In this regard, it should be appreciated that the inner decoder uses the permuted soft-values approximations to bits input to the inner encoder to produce refined soft-value approximations to bits input to the inner encoder. The inner decoder also uses the soft-value approximations to bits output from the inner encoder to produce refined soft-value approximations to bits input to the inner encoder.

SCCC decoders are often implemented on field programmable gate arrays (FPGAs) or application specific integrated circuits (ASICs). In this regard, it should be understood that an SCCC decoder is typically designed to include an input buffer memory, a processing loop module, and an output buffer memory. The input buffer memory is comprised of hardware and firmware configured to receive soft-decision bits from an external device and to temporarily store the same. With regard to the processing loop module, the burden of decoding information contained within a codeword is split between the inner decoder module and the outer decoder module. The inner decoder module is often comprised of hardware and firmware configured to obtain a sequence of soft-decision bits from the input buffer memory and/or the permutation module. Upon receipt of all or a portion of a soft-decision bit sequence, the inner decoder module begins processing the received soft-decision bits. This processing typically involves performing a relatively simple decoding operation based on a corresponding convolutional inner code. After processing the soft-decision bits, the inner decoder communicates the processed soft-decision bits to the depermutation module for depermutation (i.e., rearrangement or reorganization) and storage. It should be understood that depermutation of soft-decision bits is necessary to reverse a permutation of information bits that occurred in an encoding process.

The outer decoder module is comprised of hardware and firmware configured to receive a sequence of depermuted soft-decision bits communicated from the depermutation module. Upon receipt of all or a portion of a soft-decision bit sequence, the outer decoder module begins processing the received soft-decision bits. This processing typically involves performing a relatively simple decoding operation based on a corresponding conventional outer code. After processing the soft-decision bits, the outer decoder module communicates the processed soft-decision bits to the permutation module for permutation (i.e., rearrangement or reorganization) and storage. It should be understood that permutation is necessary to realign the soft-decision bits to the permutation that occurred in an encoding process. Thereafter, a sequence of permuted soft-decision bits is communicated, along with the original codeword, to the inner decoder module.

The above described process is performed for 'M' iterations. After 'M' iterations, the outer decoder module produces decoded information bits. Subsequently, the outer decoder module forwards the decoded information bits to the output buffer memory for storage.

Despite the advantages of such a conventional SCCC decoder, it suffers from certain drawbacks. For example, the above described decoding process requires a relatively large amount of time to complete. As such, there remains a need for a SCCC decoder having an improved processing time with a negligible performance loss.

SUMMARY OF THE INVENTION

The invention concerns a serial concatenated convolutional code (SCCC) decoder. The SCCC decoder is comprised of one or more input buffer memories, processing bop modules, and output buffer memories. Each processing loop module is comprised of a permutation module, an inner decoder module, a depermutation module, and an outer decoder module. The inner decoder module is subdivided into two (2) or more inner decoding engines configured to concurrently perform a decoding operation based en an inner convolutional code. Similarly, the outer decoder module is subdivided into two (2) or more outer decoding engines configured to concurrently perform a decoding operation based on an outer convolutional code.

According to an aspect of the invention, the SCCC decoder is implemented on a programmable device, such as a field programmable gate array or an application specific integrated circuit. According to another aspect of the invention, the SCCC decoder is comprised of an input buffer memory configured to store soft-decision bits in a codeblock format. Prior to being stored in the input buffer memory, the soft-decision bits are encoded using a forward error correction (FEC) encoding technique based on a series of convolution codes, separated by a permutation step.

Each codeblock is comprised of two (2) or more codeblock segments. Each codeblock segment includes a different selected portion of a codeblock. Each codeblock segment also includes one (1) or more overlap bit portions and a non-overlap bit portion. Each overlap bit portion includes soft-decision bits contained within two (2) or more codeblock segments. Each non-overlap bit portion includes soft-decision bits contained within a single codeblock segment.

Each of the codeblock segments is communicated, in parallel, to a respective inner decoding engine, in this regard, it should be appreciated that each inner decoding engine is configured to concurrently process a respective one (1) of the codeblock segments by performing a decoding operation based on the inner convolutional code. The inner decoding engine is designed in accordance with a maximum aposteriori probability (MAP) decoding algorithm. The inner decoding engines are also configured to communicate, in parallel, processed codeblock segments to the depermutation module in a clock cycle by clock cycle, bit by bit manner.

The depermutation module is configured to extract a soft-decision bit from each of a plurality of codeword segments. The depermutation module is also configured to sequentially communicate extracted soft-decision bits to the outer decoding engines, in this regard, it should be appreciated that each one (1) of the extracted soft-decision bits is communicated to a respective outer decoding engine. Upon receipt of a soft-decision bit, an outer decoding engine processes the soft-decision bit by performing a decoding operation based on the outer convolutional code. The outer decoding engine is designed in accordance with a maximum aposteriori probability (MAP) decoding algorithm. However, if should be understood that each outer decoding engine is configured to concurrently process a respective one (1) of the extracted soft-decision bits. The outer decoding engines are also configured to communicate, in parallel, processed soft-decision bits to the permutation module.

A method for serial concatenated convolutional decoding is also provided. The method includes receiving a codeblock at an input buffer memory of a serial concatenated convolutional code decoder and separating the codeblock into two or more codeblock segments. The method also includes concurrently communicating respective soft-decision bits from each of the codeblock segments to a respective one of a plurality of inner decoding engines. The method further includes concurrently processing in the inner decoding engines the respective soft-decision bits to generate at least one soft-decision bit from each of the inner decoding engines. The method includes concatenating a set of soft-decision bits generated by the inner decoding engines to form a codeword segment. The method includes writing the codeword segment to a depermutation buffer memory.

According to an aspect of the invention, the method includes repeating the processing, concatenating, and writing steps to respectively generate and store two or more codeword segments in the depermutation buffer memory. The method also includes depermuting the codeword segments. The method further includes extracting soft-decision bits from the codeword segments for two or more outer decoding engines.

According to another aspect of the invention, the method includes communicating the soft-decision bits extracted from the codeword segments to the outer decoding engines. The method also includes concurrently processing the soft-decision bits in the outer decoding engines to generate at least one soft-decision bit from each of the outer decoding engines. The method further includes concatenating a set of soft-decision bits generated by the outer decoding engines to form a codeword segment.

According to another aspect of the invention, the method includes writing the codeword segment to a permutation buffer memory. The method also includes repeating the processing, concatenating, and writing steps to respectively generate and store two or more codeword segments in the permutation buffer memory. The method further includes permuting the codeword segments. The method includes extracting soft-decision bits from the codeword segments for the inner decoding engines,

BRIEF DESCRIPTION OF THE DRAWINGS

Embodiments will be described with reference to the following drawing figures, in which like numerals represent like items throughout the figures, and in which:

FIGS. 7A-7B collectively illustrate a method for serial concatenated conventional decoding that is useful for understanding the invention.

DETAILED DESCRIPTION OF THE PREFERRED EMBODIMENTS

An embodiment of the present invention will now be described with respect to FIG. 1 through FIG. 7. Some embodiments of the present invention provide a serial concatenated conventional code (SCCC) decoder having an improved parallel processing time with negligible performance loss.

Figure 1:
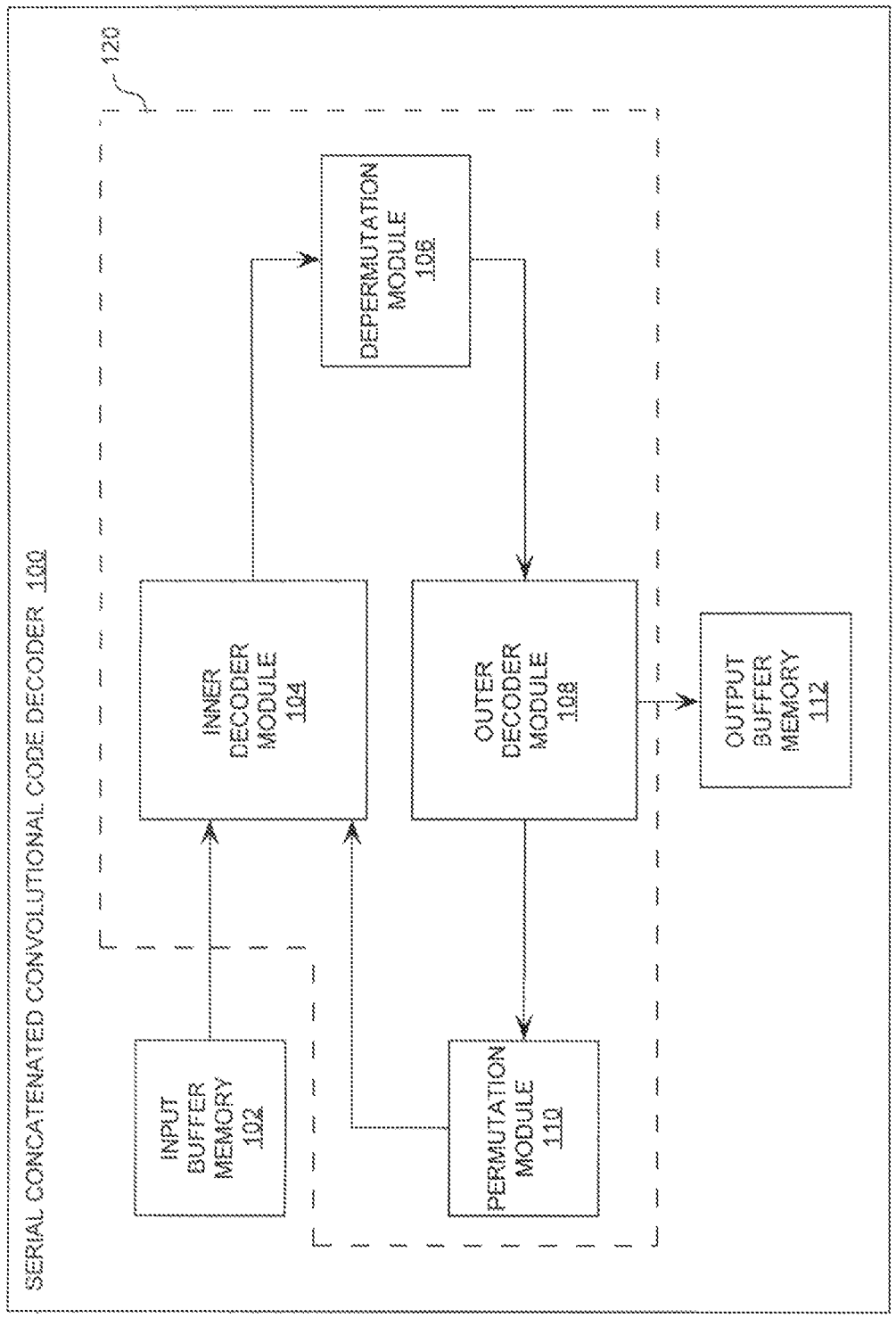
FIG. 1 is a block diagram of a serial concatenated convolutional code (SCCC) decoder that is useful for understanding the invention.

Referring now to FIG. 1, an SCCC decoder 100 is shown that is useful for understanding the invention, if should be understood that the SCCC decoder 100 is implemented on a programmable device, such as a field programmable gate array (FPGA) or an application specific integrated circuit (ASIC). According to an embodiment of the invention, the SCCC decoder 100 is advantageously selected as an FPGA having a model number XC2V8000 which is available from Xilinx, Inc., of San Jose, Calif. Still, the invention is not limited in this regard. Any programmable device having a substantially fast parallel processing time feature can be used without limitation.

As may be observed in FIG. 1, the SCCC decoder 100 is comprised of an input buffer memory 102, a processing loop module 120, and an output buffer memory 112. Although only a single input buffer memory 102, processing loop module 120, and output buffer memory 112 is shown in FIG. 1, it should be understood that the SCCC decoder 100 can be comprised of any number of these components 102, 120, 112. For example, the SCCC decoder 100 can be comprised of two (2) or more parallel processing loop modules 120.

Referring again to FIG. 1, the input buffer memory 102 provides a data store for soft-decision bits communicated from an external device (not shown) and received at the SCCC decoder 100, in this regard, if should be appreciated that the input buffer memory 102 provides a means for storing soft-decision bits in a codeblock format, Codeblock formats are well known to persons skilled in the art. Thus, codeblock formats will not be described in great detail herein. Also, methods for storing soft-decision bits in a codeblock format are well known by persons skilled in the art. Any such method can be used without limitation.

According to an embodiment of the invention, a codeblock is selected to include thousands of soft-decision bits, e.g., four thousand (4,000) thousand soft-decision bits. Still, the invention is not limited in this regard. A codeblock can be selected to include any number of soft-decision bits in accordance with a particular SCCC decoder 100 application.

As shown in FIG. 1, the input buffer memory 102 is coupled to the processing loop module 120. The processing loop module 120 is comprised of hardware and firmware configured to retrieve a codeblock of soft-decision bits from the input buffer memory 102. The processing loop module 120 is also comprised of hardware and firmware configured to perform a decoding operation based on a decoding algorithm. The decoding algorithm can be selected as a maximum aposteriori probability (MAP) based decoding algorithm. In this regard, it should be understood that the processing loop module 120 is comprised of an inner decoder module 104, a depermutation module 108, an outer decoder module 108, and a permutation module 110.

As shown in FIG. 1, the inner decoder module 104 is coupled to the input buffer memory 102, the permutation module 110, and the depermutation module 106. The inner decoder module 104 is comprised of hardware and firmware configured to receive two (2) or more codeblock segments communicated, in parallel, from the input buffer memory 102. The inner decoder module 104 is also comprised of hardware and firmware configured to receive two (2) or more soft-decision bits communicated, sequentially, from the permutation module 110. The inner decoder module 104 is further comprised of hardware and firmware configured to process soft-decision bits contained in a codeblock segment received from the input buffer memory 102. Similarly, the inner decoder module 104 is further comprised of hardware and firmware configured to process soft-decision bits received from the permutation module 110. The inner decoder module 104 is comprised of hardware and firmware configured to communicate, in parallel, processed soft-decision bits to the depermutation module 106. The inner decoder module 104 will be described in greater detail below in relation to FIG. 2.

The depermutation module 106 is comprised of hardware and firmware configured to receive processed soft-decision hits communicated, in parallel, from the inner decoder module 104. The depermutation module 106 is also comprised of hardware and firmware configured to serially link two or more soft-decision bits together to form a codeword segment. The depermutation module 106 is further comprised of hardware and firmware configured to sequentially forward codeword segments to a depermutation buffer memory (described below in relation to FIG. 3) for storage as a single codeword.

As shown in FIG. 1, the depermutation module 106 is coupled to the outer decoder module 108. In this regard, it should be appreciated that the depermutation module 106 is comprised of hardware and firmware configured to retrieve codeword segments from the depermutation buffer memory (described below in relation to FIG. 3). In this regard, it should be appreciated that the codeword segments are read from the depermutation buffer memory in an order different from an order in which the codeword segments are written to the depermutation buffer memory for storage. The depermutation module 106 is further comprised of hardware and firmware configured to extract soft-decision bits from the retrieved codeword segments. The depermutation module 106 is comprised of hardware and firmware configured to sequentially communicate the extracted soft-decision bits to the outer decoder module 108 for processing. The depermutation module 106 will be described in greater detail below in relation to FIG. 3.

The outer decoder module 108 is comprised of hardware and firmware configured to receive soft-decision n bits communicated, sequentially, from the depermutation module 106. The outer decoder module 108 is also comprised of hardware and firmware configured to process soft-decision bits received from the depermutation module 106. The outer decoder module 108 is further comprised of hardware and firmware configured to communicate, in parallel, two (2) or more processed soft-decision hits to the permutation module 110 or the output buffer memory 112. The outer decoder module 108 will be described in greater detail below in relation to FIG. 4.

The permutation module 110 is comprised of hardware and firmware configured to receive processed soft-decision bits communicated, in parallel, from the outer decoder module 108. The permutation module 110 is also comprised of hardware and firmware configured to serially link two or more soft-decision bits together to form a codeword segment. The permutation module 110 is further comprised of hardware and firmware configured to sequentially forward codeword segments to a permutation buffer memory (described below in relation to FIG. 5) for storage as a single codeword.

As shown in FIG. 1, the permutation module 110 is coupled to the inner decoder module 104. In this regard, it should be appreciated that the permutation module 110 is comprised of hardware and firmware configured to retrieve codeword segments from the permutation buffer memory (described below in relation to FIG. 5). In this regard, it should be appreciated that the codeword segments are read from the permutation buffer memory in an order different from an order in which the codeword segments are written to the permutation buffer memory for storage. The permutation module 110 is further comprised of hardware and firmware configured to extract soft-decision bits from the codeword segments. The permutation module 110 is comprised of hardware and firmware configured to sequentially forward the extracted soft-decision bits to the inner decoder module 104 for processing. The permutation module 110 will be described in greater detail below in relation to FIG. 5.

A person skilled in the art will appreciate that the SCCC decoder 100 is one architecture of a SCCC decoder. However, the invention is not limited in this regard and any other SCCC decoder architecture can be used without limitation.

Figure 2:
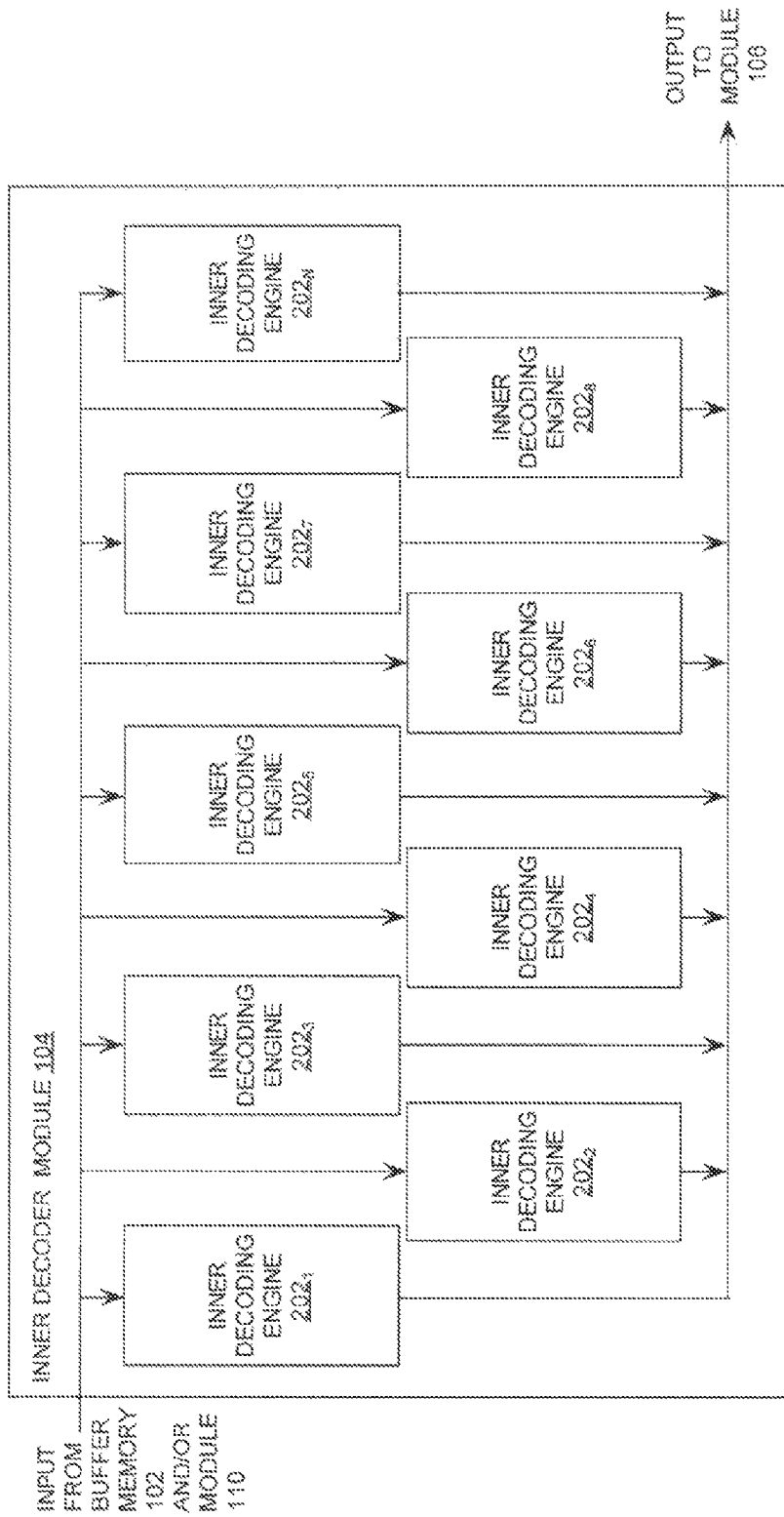
FIG. 2 is a detailed block diagram of an inner decoder module that is useful for understanding the invention.

Referring now to FIG. 2, there is provided a detailed block diagram of an inner decoder module 104 that is useful for understanding the invention. As shown in FIG. 2, the inner decoder module 104 is subdivided into 'N' inner decoding engines $202_1$-$202_N$. The inner decoding engines $202_1$-$202_N$ are configured to concurrently perform a decoding operation based on a decoding algorithm. According to an embodiment of the invention, the inner decoder module 104 is a maximum apostariori probability (MAP) based decoder. Accordingly, the decoding engines $202_1$-$202_N$ can each be configured with a MAP decoding algorithm. MAP based decoders are well known to persons skilled in the art. Thus, MAP based decoders will not foe described in great detail herein. However, it should be appreciated that the present invention is not limited in this regard, it should also be appreciated that such a multi-inner decoding engine architecture provides an improved processing time feature to the inner decoder module 104, i.e., the inner decoder module 104 can process more soft-decision bits in the same amount of time as a conventional inner decoder module.

The inner decoder module 104 can further include a device (not shown) configured to simultaneously retrieve 'N' codeblock segments from the input buffer memory 102. The device can also be configured to forward a particular codeblock segment of the 'N' codeblock segments to a certain inner decoding engine $202_1$-$202_N$. The device can further be configured to communicate, in parallel, 'N' codeblock segments to 'N' inner decoding engines $202_1$-$202_N$, respectively.

Figure 3:
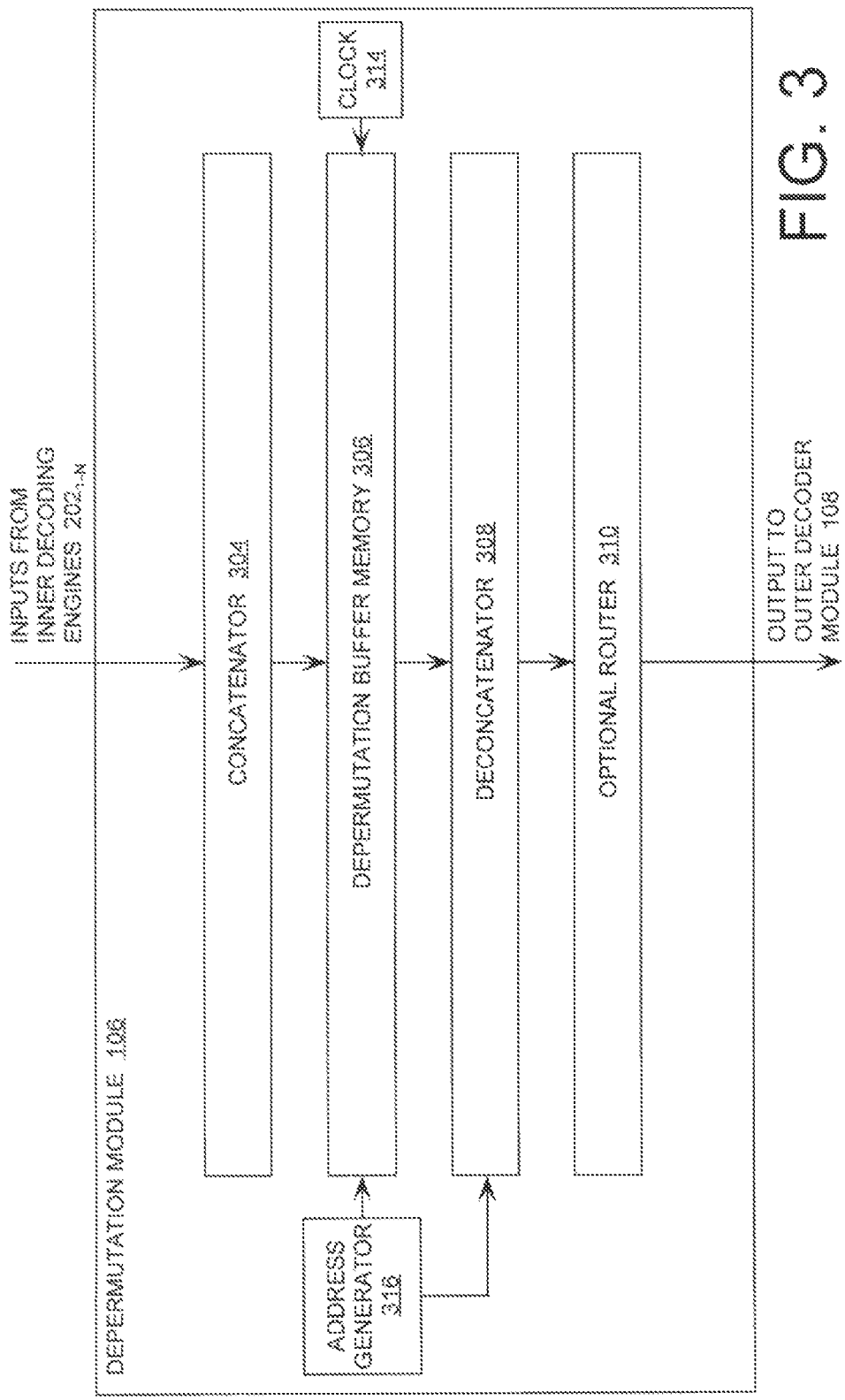
FIG. 3 is a detailed block diagram of a depermutation module that is useful for understanding the invention.

Referring now to FIG. 3, there is provided a detailed block diagram of a depermutation module 106 that is useful for understanding the invention. As shown in FIG. 3, the depermutation module 108 is comprised of a concatenate 304, a depermutation buffer memory 306, a deconcatenator 308, an optional router 310, a clock 314, and an address generator 316. Each of these components is well known to a person skilled in the art. Thus, the listed components will not be described in great detail herein. However, a brief description of the listed components is provided below to assist a reader in understanding the present invention.

Referring again to FIG. 3, the concatenator 304 is comprised of hardware and firmware configured to receive soft-decision bits communicated, in parallel, from each inner decoding engine $202_1$-$202_N$ (described above in relation to FIG. 2). The concatenator 304 is also comprised of hardware and firmware configured to serially link the soft-decision bits received from the inner decoding engines $202_1$-$202_N$ to form a codeword segment. The concatenator 304 is further comprised of hardware and firmware configured to sequentially forward codeword segments to the depermutation buffer memory 306 for storage as a single codeword.

The deconcatenator 308 is comprised of hardware and firmware configured to sequentially retrieve codeword segments from the depermutation buffer memory 306. However, it should he understood that the codeword segments are read from the depermutation buffer memory 306 in an order different from an order in which the codeword segments are written to the depermutation buffer memory 306 for storage. The deconcatenator 308 is also comprised of hardware and firmware configured to break a codeword segment into a plurality of soft-decision bits, extract a particular soft-decision bit from the plurality of soft-decision bits and forward the extracted soft-decision bit to the optional router 310. The optional router 310 is comprised of hardware and firmware configured to sequentially communicate soft-decision bits to an outer decoder module 108 (described above in relation to FIG. 1 and below in relation to FIG. 4).

A person skilled in the art will appreciate that the depermutation module 106 is one architecture of a depermutation module. However, the invention is not limited in this regard and any other depermutation module architecture can be used without limitation.

Figure 4:
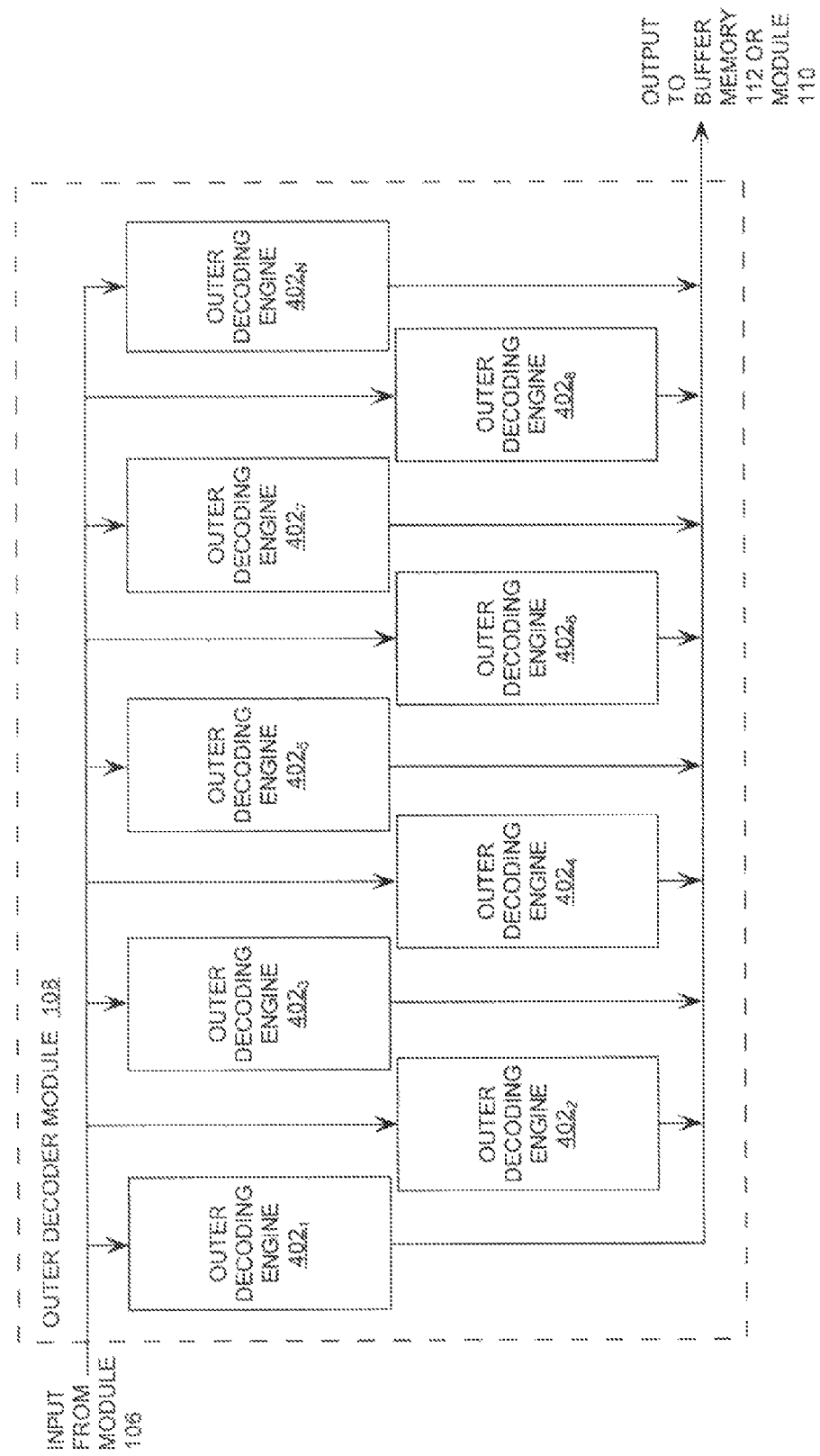
FIG. 4 is a detailed block diagram of an outer decoder module that is useful for understanding the invention.

Referring now to FIG. 4, there is provided a detailed block diagram of an outer decoder module 108 that is useful for understanding the invention. As shown in FIG. 4, the outer decoder module 108 is subdivided into 'N' outer decoding engines $402_1$-$402_N$. The outer decoding engines $402_1$-$402_N$ are configured to concurrently perform a decoding operation based on a decoding algorithm. According to an embodiment of the invention, the outer decoder module 108 is a maximum aposteriori probability (MAP) based decoder. Accordingly, the outer decoding engines $402_1$-$402_N$ can each be configured with a MAP type decoding algorithm. MAP based decoders are well known to persons skilled in the art. Thus, MAP based decoders will not be described in great detail herein. However, it should be appreciated that the present invention is not limited in this regard. It should also be appreciated that such a multi-outer decoding engine architecture provides an improved processing time feature to the outer decoder module 108, i.e., the outer decoder module 108 can process more soft-decision bits in the same amount of time as a conventional outer decoder module.

The outer decoder module 108 can include a device (not shown) configured to sequentially communicate 'N' codeword segments to an output buffer memory 112 (described above in relation to FIG. 1) for storage. The outer decoder module 108 can also include a device configured to concatenate 'N' codeword segments to form a single codeword. The outer decoder module 108 can also include a device configured to communicate a codeword to an output buffer memory 112 for storage in a memory location having a single address.

Figure 5:
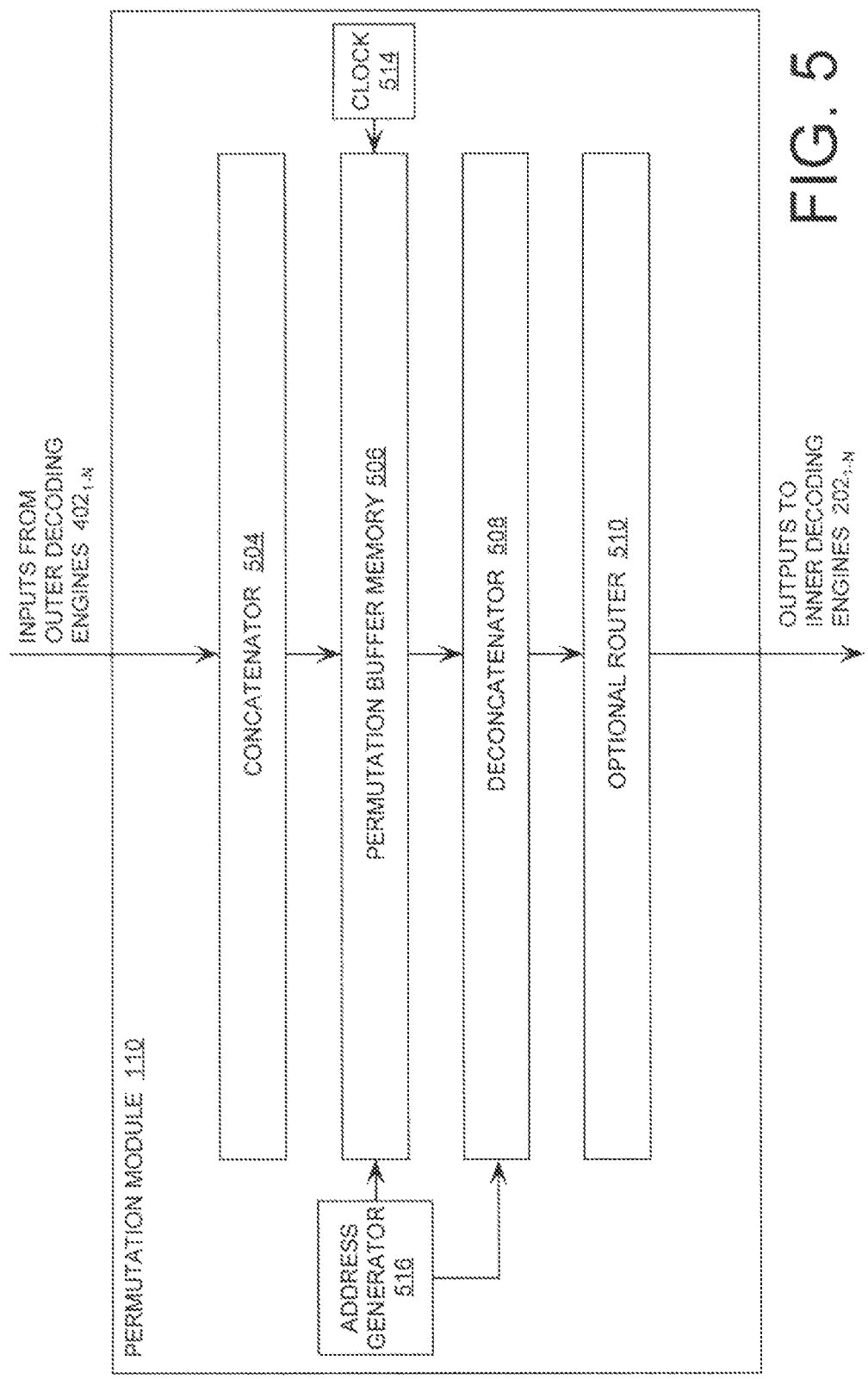
FIG. 5 is a detailed block diagram of a permutation module that is useful for understanding the invention.

Referring now to FIG. 5, there is provided a detailed block diagram of a permutation module 110 that is useful for understanding the invention. As shown in FIG. 5, the permutation module 106 is comprised of a concatenate 504, a permutation buffer memory 506, a deconcatenator 508, an optional router 510, a clock 614, and an address generator 516. Each of these components is well known to a person skilled in the art. Thus, the listed components will not be described in great detail herein. However, a brief description of the listed components is provided below to assist a reader in understanding the present invention.

Referring again to FIG. 5, the concatenator 504 is comprised of hardware and firmware configured to receive soft-decision hits communicated, in parallel, from each outer decoding engine $402_1$-$402_N$ (described above in relation to FIG. 4). The concatenator 504 is also comprised of hardware and firmware configured to serially link the soft-decision bits received from the outer decoding engines $402_1$-$402_N$ to form a codeword segment. The concatenator 504 is further comprised of hardware and firmware configured to sequentially forward codeword segments to the permutation buffer memory 506 for storage as a single codeword.

The deconcatenator 508 is comprised of hardware and firmware configured to sequentially retrieve codeword segments from the permutation buffer memory 506. However, it should be understood that the codeword segments are read from the permutation buffer memory 506 in an order different from an order in which the codeword segments are written to the permutation buffer memory 506 for storage. The deconcatenator 508 is also comprised of hardware and firmware configured to break a codeword segment into a plurality of soft-decision bits, extract a particular soft-decision bit from the plurality of soft-decision bits, and forward the extracted soft-decision bit to the optional router 510. The optional router 510 is comprised of hardware and firmware configured to sequentially communicate soft-decision bits to the inner decoding engines $202_1$-$202_N$ (described above in relation to FIG. 2).

A person skilled in the art will appreciate that the permutation module 110 is one architecture of a permutation module. However, the invention is not limited in this regard and any other permutation module architecture can be used without limitation.

Figure 6A:
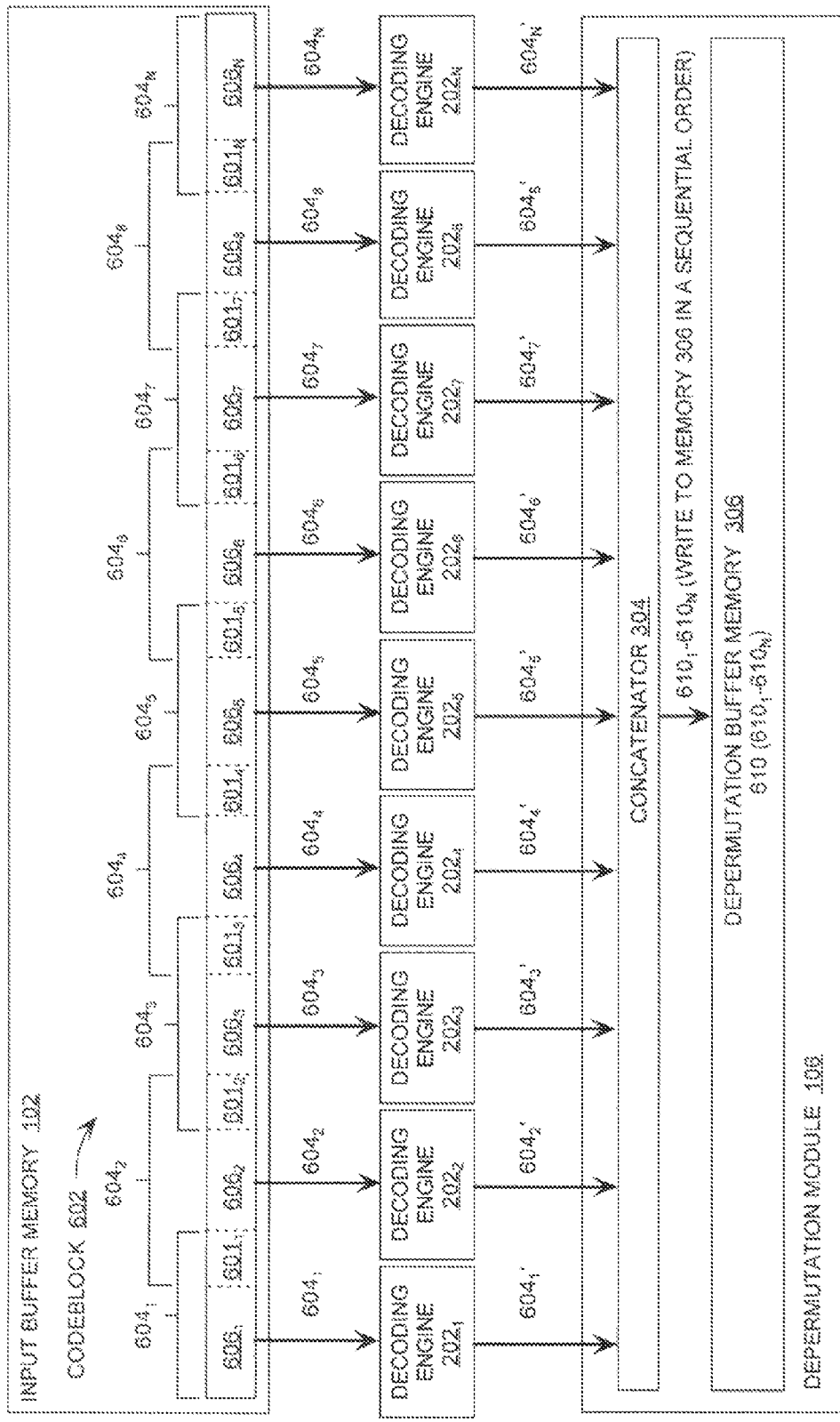
FIGS. 6A-6C collectively illustrate an operation of an SCCC decoder that is useful for understanding the invention.

The operation of the SCCC decoder 100 will now be described in detail with regards to FIG. 6A through FIG. 6C. As shown in FIG. 6A, a codeblock 602 is stored in an input buffer memory 102. It should be understood that the codeblock 602 is comprised of soft-decision bits (for example, four (4) thousand soft-decision bits) encoded using a forward error correction (FEC) encoding technique based on a series of convolution codes, separated by a permutation step.

Referring again to FIG. 6A, the codeblock 602 is comprised of 'N' codeblock segments $604_1$-$604_N$. Each codeblock segment $604_1$-$604_N$ is comprised of one (1) or more overlap bit portions $601_1$-$601_N$ and a non-overlap bit portion $606_1$-$606_N$. For example, the codeblock segment $604_2$ is comprised of a front-end overlap bit portion $601_1$, a non-overlap bit portion $606_2$, and a back-end overlap bit portion $601_2$. It should be appreciated that each overlap bit portion $601_1$-$601_N$ is comprised of a number of soft-decision bits in accordance with a particular decoding scheme implemented in a SCCC decoder 100. It should also be appreciated that each overlap bit portion $601_1$-$601_N$ includes soft-decision bits contained within two (2) or more codeblock segments $604_1$-$604_N$. It should further he appreciated that each non-overlap bit portion $604_1$-$604_N$ includes soft-decision bits contained within a single codeblock segment $604_1$-$604_N$.

As shown in FIG. 6A, each inner decoding engine $202_1$-$202_N$ retrieves, in parallel, a respective codeblock segment $604_1$-$604_N$ from the input buffer memory 102. For example, the inner decoding engine $202_1$ retrieves a codeblock segment $604_1$ from an input buffer memory 102 location having a first address. Similarly, the inner decoding engine $202_2$ retrieves a codeblock segment $604_2$ from an input buffer memory 102 location having a second address. Likewise, each inner decoding engine $202_3$-$202_N$ retrieves a respective codeblock segment $604_3$-$604_N$ from input buffer memory 102 locations having different addresses.

However, it should be understood that each inner decoding engine $202_1$-$201_N$ retrieves a codeblock segment $604_1$-$604_N$ in a clock cycle by clock cycle, bit(s) by bit(s) manner. For example, the inner decoding engine $202_2$ receives a first one or a first set of soft-decision bits included in the front-end overlap bit portion $601_1$ during a first clock cycle. Thereafter, the inner decoding engine $202_2$ receives a second one or a second set of soft-decision bits included in the front end overlap bit portion $601_1$ during a second clock cycle. Subsequently, the inner decoding engine $202_2$ receives a third one or a third set of soft-decision bits included in the non-overlap bit portion $606_2$ during a third clock cycle, and so on, Upon receipt of a first bit or a first set of soft-decision hits, each inner decoding engine $202_1$-$202_N$ begins performing a decoding operation based on an inner conventional code. The decoding operation is performed to partially decode soft-decision bits contained within a respective codeblock segment $604_1$-$604_N$. According to an embodiment of the invention, each inner decoding engine utilizes a maximum aposteriori probability (MAP) decoding algorithm designed in accordance with the inner conventional code. As will be understood by a person skilled in the ad, there are many MAP based decoding algorithms that can be implemented within an inner decoding engine $202_1$-$202_N$. Any such MAP based decoding algorithm can be used without limitation, provided that it corresponds to a particular encoding scheme used for encoding information bits contained within the codeblock 602.

Referring again to FIG. 6A, each inner decoding engine $202_1$-$202_N$ concurrently processes soft-decision bits contained within a respective codeblock segment $604_1$-$604_N$. In this regard, it should be appreciated that the inner decoding engines $202_1$-$202_N$ do not produce outputs corresponding to all soft-decision bits contained within an overlap bit portion $601_1$-$601_N$. In effect, the inner decoding engines $202_1$-$202_N$ avoid an error rate increase that would otherwise occur with codeblock segmentation. For example, the inner decoding engine $202_2$ does not produce an output corresponding to a first sixteen (16) soft-decision bits of the front-end overlap bit portion $601_1$ and a last sixteen (16) soft-decision bits of the back-end overlap bit portion $601_2$. As such, the inner decoding engine $202_2$ outputs a processed codeblock segment $604_2$' that is absent of the first sixteen (16) soft-decision bits of the front-end overlap bit portion $601_1$ and the last sixteen (16) soft-decision bits of the back-end overlap bit portion $601_2$. Still, the invention is not limited in this regard.

After concurrently processing soft-decision bits contained within a respective codeblock segment $604_1$-$604_N$, the inner decoding engines $202_1$-$202_N$ communicate, in parallel, the processed codeblock segments $604_1$'-$604_N$' to a concatenated 304 of the depermutation module 106. In this regard, it should be appreciated that the processed codeblock segments $604_1$'-$604_N$' are communicated to the concatenator 304 in a clock cycle by clock cycle, sequential bit by bit manner. For example, a first soft-decision bit of each processed codeblock segment $604_1$'-$604_N$' is communicated, in parallel, to the concatenator 304 in a first clock cycle. A second soft-decision bit of each processed codeblock segment $604_1$'-$604_N$' is communicated, in parallel, to the concatenator 304 in a second clock, cycle, and so on, Upon receipt of a first soft-decision bit from each inner decoding engine $202_1$-$202_N$ the concatenator 304 serially links the same together to form a first codeword segment $610_1$ comprised of 'N' decoded soft-decision bits. Thereafter, the concatenator 304 forwards the first: codeword segment $610_1$ to the depermutation buffer memory 306 for storage. Similarly, the concatenator 304 serially links a set of second soft-decision bits received from the inner decoding engines $202_1$-$202_N$ to form a second codeword segment $610_2$ comprised of 'N' decoded soft-decision hits. Once the second codeword segment $610_2$ is formed, the concatenator 304 forwards the second codeword segment $610_2$ to the depermutation buffer memory 306 for storage. The concatenator 304 repeats this process until all soft-decision hits contained in each codeblock segment $604_1'$-$604_N'$ have been communicated to the concatenator 304 and forwarded to the depermutation buffer memory 306 for storage as codeword segments $610_3$-$610_N$. As shown in FIG. 6A, the codeword segments $610_1$-$610_N$ are stored in the depermutation buffer memory 308 as a single codeword 610.

Figure 6B:
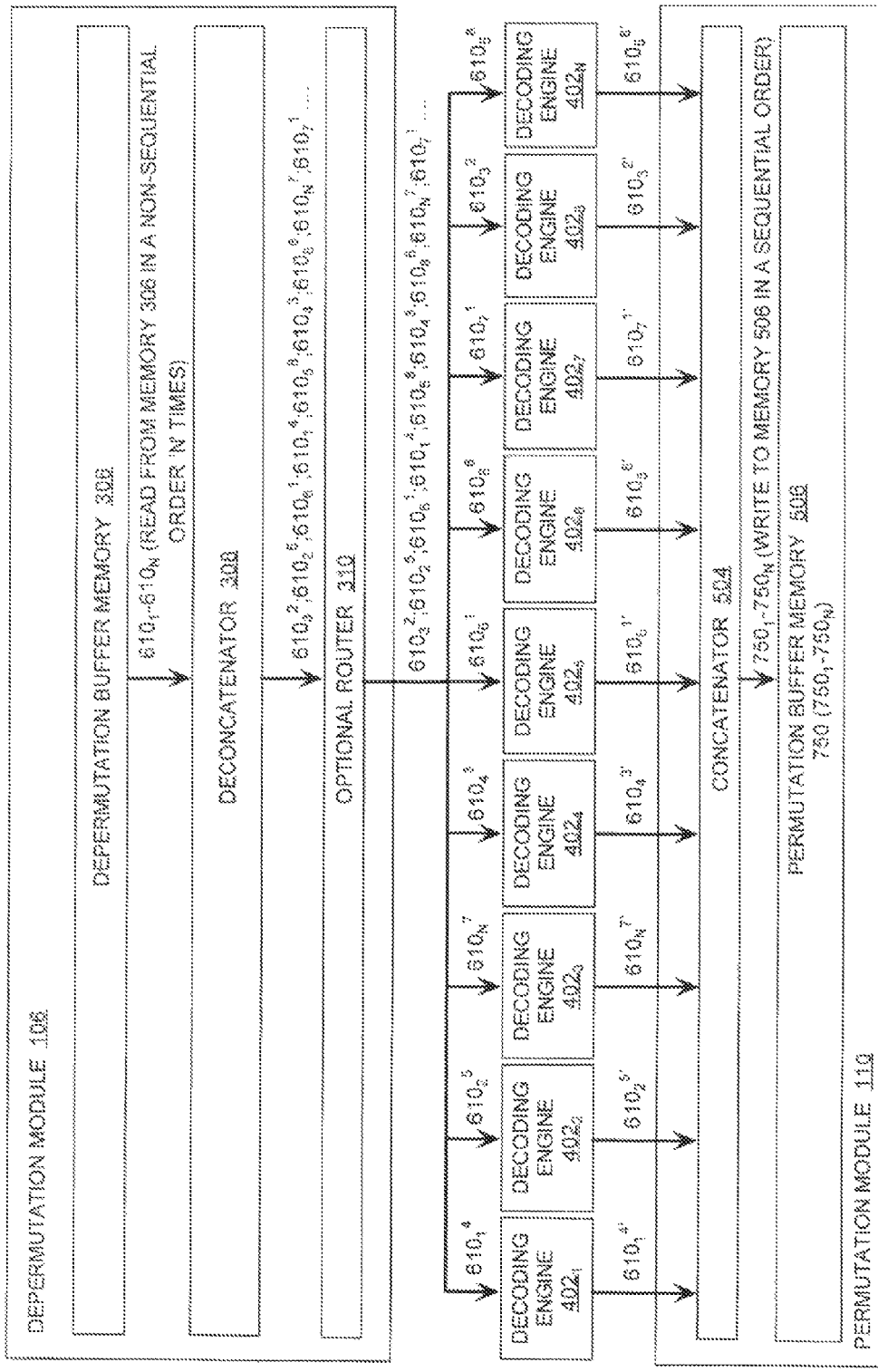

As shown in FIG. 6B, the depermutation module 106 is coupled to each outer decoding engine $402_1$-$402_N$. As such, the deconcatenator 308 sequentially retrieves codeword segments $610_1$-$610_N$ from a depermutation buffer memory 306. In this regard, it should be understood that the deconcatenator 308 retrieves a single codeword segment per clock cycle. For example, the deconcatenator 308 retrieves a codeword segment $610_1$ during a first clock cycle. The deconcatenator 308 retrieves a codeword segment $610_4$ during a second clock cycle, and so on.

It should also be understood that the codeword segments $610_1$-$610_N$ are retrieved from the depermutation buffer memory 308 in an order different from the order in which the codeword segments $610_1$-$610_N$ were written to the depermutation buffer memory 306 for storage. As will be understood by a person skilled in the art, the order in which the codeword segments $610_1$-$610_N$ are retrieved from the depermutation buffer memory 306 is determined by the address generator 316 (described above in relation to FIG. 3) using data contained in a depermutation table stored in a memory (not shown) of the SCCC decoder 100. For example, the address generator 316 retrieves data from the depermutation table and performs processing on the data to generate a plurality of non-sequentially ordered depermutation buffer memory 306 location addresses.

It should further be understood that each codeword segment $610_1$-$610_N$ is retrieved from the depermutation buffer memory 306 a plurality of times so that each soft-decision bit contained in the codeword segments $610_1$-$610_N$ is processed by a respective outer decoding engine $402_1$-$402_N$. For example, if a codeword segment $610_1$-$610_N$ includes 'N' decoded soft-decision bits, then the codeword segment $610_1$-$610_N$ is retrieved from the depermutation buffer memory 306 'N' times.

Once the deconcatenator 308 receives a codeword segment $610_1$-$610_N$, the deconcatenator 308 performs processing on the codeword segment $610_1$-$610_N$ to break the codeword segment $610_1$-$610_N$ into a plurality of soft-decision bits and extract a particular soft-decision bit therefrom. After processing a received codeword segment $610_1$-$610_N$, the deconcatenator 308 forwards the extracted soft-decision bit $610_3{}^2$, $610_2{}^5$, $610_6{}^1$, $610_1{}^4$, $610_5{}^6$, $610_4{}^3$, $610_8{}^6$, $610_N{}^7$, $610_7{}^1$ to an optional router 310. In turn, the optional router 310 forwards the soft-decision bit $610_3{}^2$, $610_2{}^5$, $610_6{}^1$, $610_1{}^4$, $610_5{}^8$, $610_4{}^3$, $610_8{}^6$, $610_N{}^7$, $610_7{}^1$ to a particular outer decoding engine $401_1$-$402_N$. In this regard, it should be understood that the outer decoding engines $402_1$-$402_N$ sequentially receive soft-decision bits from the optional router 310, i.e., the optional router 310 forwards a single soft-decision ditto an outer decoding engine $402_1$-$402_N$ per clock cycle. For example, the optional router 310 forwards a second soft-decision bit $610_3{}^2$ of a codeword segment $610_3$ to an outer decoding engine $402_8$ during a fourth clock cycle. Similarly, the optional router 310 forwards an eighth soft-decision bit $610_5{}^8$ of a codeword segment $610_5$ to an outer decoding engine $402_N$ during a sixth clock cycle, and so on.

Upon receipt of a soft-decision bit, an outer decoding engine $402_1$-$402_N$ begins performing a decoding operation based on a decoding algorithm. For example, a MAP type decoding algorithm can be used for this purpose. This decoding operation is performed for processing a soft-decision bit $610_3{}^2$, $610_2{}^5$, $610_1{}^4$, $610_5{}^8$, $610_4{}^3$, $610_8{}^6$, $610_N{}^7$, $610_7{}^1$. In this regard, it should be appreciated that the outer decoding engines $402_1$-$402_N$ are configured to concurrently process respective soft-decision bits $610_3{}^2$, $610_2{}^5$, $610_6{}^1$, $610_1{}^4$, $610_5{}^8$, $610_4{}^3$, $610_8{}^6$, $610_N{}^7$, $610_7{}^1$. After processing the soft-decision bits $610_3{}^2$, $610_2{}^5$, $610_1{}^4$, $610_6{}^8$, $610_4{}^3$, $610_8{}^6$, $610_N{}^7$, $610_6{}^1$, the outer decoding engines $402_1$-$402_N$ communicate, in parallel, the processed soft-decision bits $610_3{}^{2\prime}$, $610_2{}^{5\prime}$, $610_6{}^{1\prime}$, $610_1{}^{4\prime}$, $610_5{}^{8\prime}$, $610_4{}^{3\prime}$, $610_8{}^{6\prime}$, $610_N{}^{7\prime}$, $610_7{}^{1\prime}$ to a concatenator 504 of a permutation module 110. It should be appreciated that the outer decoding engines $402_1$-$402_N$ repeat this process until all soft-decision bits contained in a codeword 610 have been processed by a respective outer decoding engine $402_1$-$402_N$ and forwarded to the concatenator 504.

Upon receipt of a processed soft-decision bit $610_3{}^{2\prime}$, $610_2{}^{5\prime}$, $610_6{}^{1\prime}$, $610_1{}^{4\prime}$, $610_5{}^{8\prime}$, $610_4{}^{3\prime}$, $610_8{}^{6\prime}$, $610_N{}^{7\prime}$, $610_7{}^{1\prime}$ from each outer decoding engine $402_1$-$402_N$, the concatenator 504 serially links the same together to form a first codeword segment $750_1$. The concatenator 504 forwards the first codeword segment $750_1$ to the permutation buffer memory 506 for storage. The concatenator 504 repeats this process until all the soft-decision bits contained in each codeword segment $610_1$-$610_N$ have been processed by the outer decoding engines $402_1$-$402_N$, communicated to the concatenator 504, and forwarded to the permutation buffer memory 506 as codeword segments $750_2$-$750_N$. As shown in FIG. 86, the codeword segments $750_2$-$750_N$ are stored in the permutation buffer memory 508 as a single codeword 750.

Figure 6C:
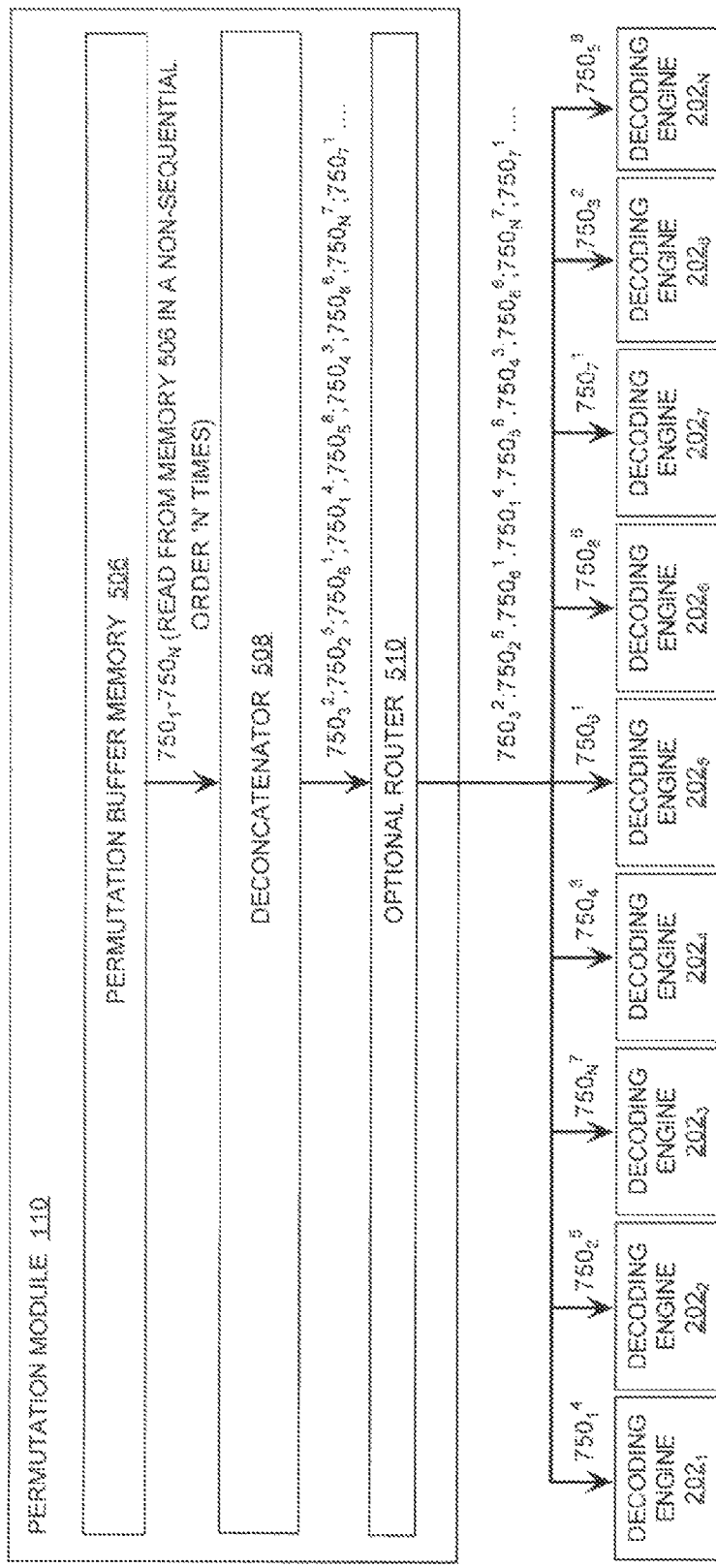
Figure 7B:
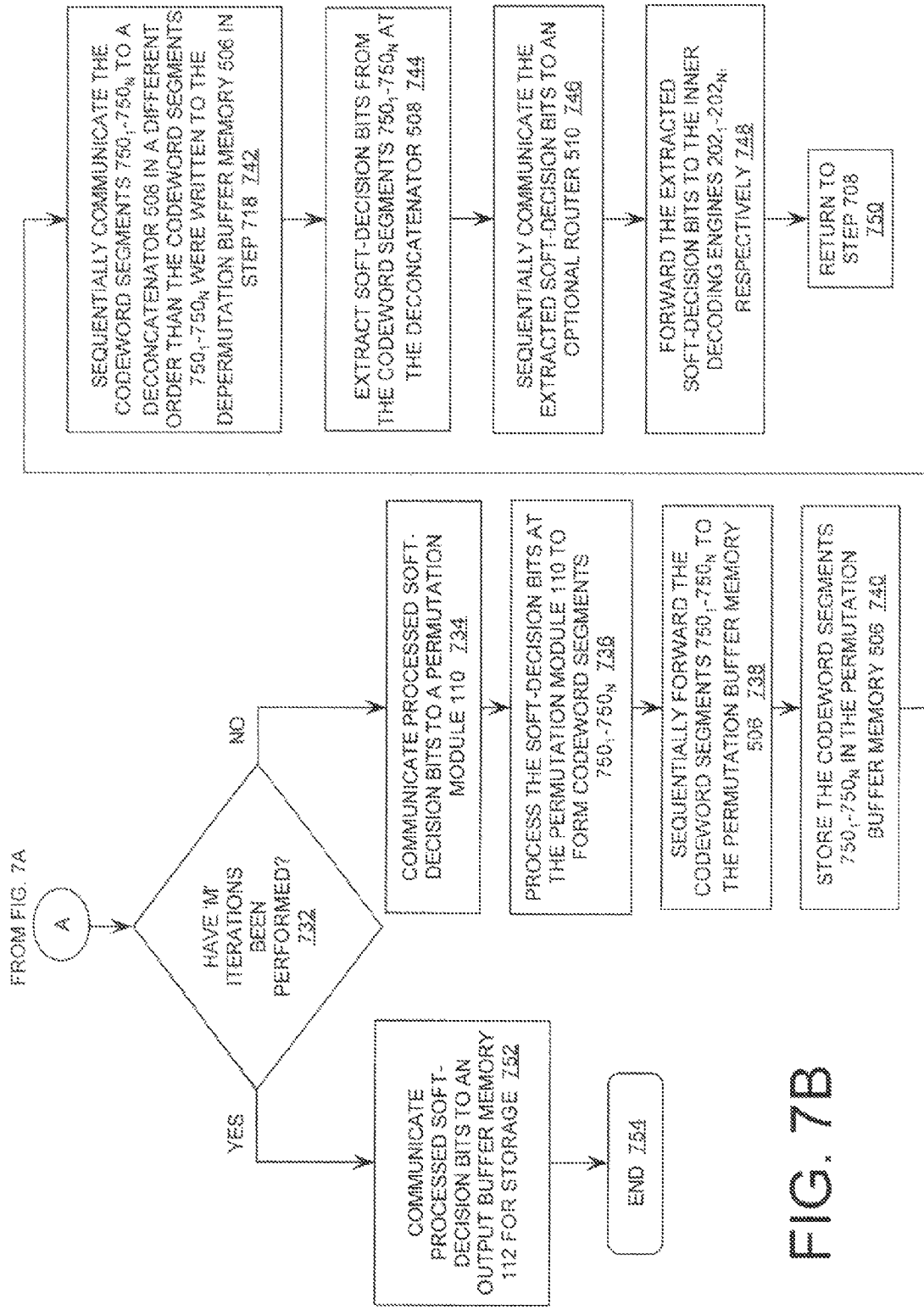

As shown in FIG. 6C, a permutation module 110 is coupled to each inner decoding engine $202_1$-$202_N$. As such, the deconcatenator 508 sequentially retrieves codeword segments $750_1$-$750_N$ from a permutation buffer memory 508. In this regard, it should be understood that the deconcatenator 608 retrieves a single codeword segment per clock cycle. For example, the deconcatenator 508 retrieves a codeword segment $750_1$ during a first clock cycle. The deconcatenator 508 retrieves a codeword segment $750_4$ during a second clock cycle, and so on.

It should also he understood that the codeword segments $750_1$-$750_N$ are retrieved from the permutation buffer memory 506 in an order different from the order in which the codeword segments $750_1$-$750_N$ were written to the permutation buffer memory 506 for storage. As will be understood by a person skilled in the art, the order in which the codeword segments $750_1$-$750_N$ are retrieved from the permutation buffer memory 506 is determined by the address generator 516 (described above in relation to FIG. 5) using data contained in a permutation table stored in a memory (not shown) of the SCCC decoder 100. For example, the address generator 516 retrieves data from the permutation table and performs processing on the data to generate a plurality of non-sequentially ordered permutation buffer memory 506 location addresses.

It should further be understood that each codeword segment $750_1$-$750_N$ is retrieved from the permutation buffer memory 506 a plurality of times so that each soft-decision bit contained in the codeword segments $750_1$-$750_N$ is processed by a respective inner decoding engine $202_1$-$202_N$. For example, if a codeword segment $750_1$-$750_N$ includes 'N' decoded soft-decision bits, then the codeword segment $750_1$-$750_N$ is retrieved from the permutation buffer memory 506 'N' times.

Once the deconcatenator 508 receives a codeword segment $750_1$-$750_N$, the deconcatenator 508 performs processing on the codeword segment $750_1$-$750_N$ to break the codeword segment $750_1$-$750_N$ into a plurality of soft-decision bits and extract a particular soft-decision bit therefrom. After processing the codeword segment $750_1$-$750_N$, the deconcatenator 508 forwards the extracted soft-decision bit $750_3^2$, $750_2^5$, $750_6^1$, $750_1^4$, $750_5^8$, $750_4^3$, $750_8^6$, $750_7^7$, $750_7^1$ to an optional router 510. In turn, the optional router 510 forwards the soft-decision bit $750_3^2$, $750_2^5$, $750_6^1$, $750_1^4$, $750_5^8$, $750_4^3$, $750_8^6$, $750_7^7$, $750_7^1$ to a particular inner decoding engine $202_{1-N}$. In this regard, it should be appreciated that the inner decoding engines $202_1$-$202_N$ sequentially receive soft-decision bits from the optional router 510, i.e., the optional router 510.forwards a single soft-decision bit to an inner decoding engine $202_1$-$202_N$ per clock cycle. For example, the optional router 510 forwards a second soft-decision bit $750_3^2$ of a codeword segment $750_3$ to an inner decoding engine $202_8$ during a fourth clock cycle. Similarly, the optional router 510 forwards an eighth soft-decision bit $750_5^8$ of a codeword segment $750_5$ to an inner decoding engine $202_N$ during a sixth clock, cycle, and so on.

A person skilled in the art will appreciate that the schematics of FIGS. 6A-6C collectively illustrate one embodiment of an operation of the SCCC decoder 100. However, the invention is not limited in this regard and any equivalent embodiments are intended to be within the scope of the present invention.

Referring now to FIG. 7, there is provided a flow diagram of a method 700 for serial concatenated convolutional decoding that is useful for understanding the invention. The method 700 begins at step 702 and continues with step 704. In step 704, a codeblock 802 is received at an input buffer memory 102. In step 706, the codeblock 602 is broken into 'N' codeblock segments $604_1$-$604_N$. The 'N' codeblock segments $604_1$-$604_N$ each have overlap bits $601_1$-$601_N$ and non-overlap bits $606_1$-$606_N$. After step 706, the method 700 continues with step 708 where each codeblock segment $604_1$-$604_N$ is communicated, in parallel, to a respective inner decoding engine $202_1$-$202_N$ in a clock cycle by clock cycle, sequential bit(s) by bit(s) manner. Upon receipt of all or a portion of a codeblock segment $604_1$-$604_N$, the inner decoding engines $202_1$-$202_N$ begin performing a decoding operation based on an inner conventional code and concurrently process received soft-decision bits. In this regard, it should be appreciated that the inner convolutional code is designed in accordance with a maximum aposteriori probability (MAP) based decoding algorithm. After step 710, step 712 is performed where the inner decoding engines $202_{1-N}$ communicate, in parallel, the processed codeblock segments $604_1'$-$604_N'$ to a depermutation module 106 in a clock cycle by clock cycle, bit by bit manner.

In step 714, the depermutation module 106 processes the codeblock segments $604_1'$-$604_N'$ to form codeword segments $610_1$-$610_N$. Thereafter, step 716 is performed where the codeword segments $610_1$-$610_N$ are sequentially forwarded to the depermutation buffer memory 306 for storage. After step 716, the method 700 continues with step 718. In step 718, the codeword segments $610_1$-$610_N$ are stored in the depermutation buffer memory 306. Subsequently, step 720 is performed where the codeword segments $610_1$$610_N$ are sequentially communicated to a deconcatenator 308. In this regard, if should be appreciated that the codeword segments $610_1$-$610_N$ are communicated to the deconcatenator 308 in a different order than the codeword segments $610_1$-$610_N$ were written to the depermutation buffer memory 306 in step 718. In step 722, the deconcatenator 308 extracts soft-decision bits from the codeword segments $610_1$-$610_N$. Subsequently, the deconcatenator 308 sequentially communicates the extracted soft-decision bits to an optional router 310.

In step 726, the optional router 310 forwards the extracted soft-decision bits to the outer decoding engines $402_1$-$402_N$, respectively. In step 728, each soft-decision hit is processed in a respective outer decoding engine $402_1$-$402_N$, in this regard, it should be understood that the outer decoding engines $402_1$-$402_N$ perform a decoding operation based on an outer convolutional code. The outer convolutional code is designed in accordance with a maximum aposteriori probability (MAP) based decoding algorithm. Subsequently, the method 700 continues with a decision step 732 of FIG. 7B.

If "M" iterations have not been performed (732:NO), then step 734 is performed where processed soft-decision bits are communicated, in parallel, to a permutation module 110. After step 734, step 738 is performed where the permutation module 110 processes the soft-decision bits to form codeword segments $750_1$-$750_N$. Thereafter, step 738 is performed where the codeword segments $750_1$-$750_N$ are sequentially communicated to a permutation buffer memory 506, After step 738, the method 700 continues with step 740. In step 740, the codeword segments $750_1$-$750_N$ are stored in the permutation buffer memory 506, Subsequently, step 742 is performed where the codeword segments $750_1$-$750_N$ are sequentially communicated to a deconcatenator 508, in this regard, it should be appreciated that the codeword segments $750_1$-$750_N$ are communicated to the deconcatenator 508 in a different order than the codeword segments $750_1$-$750_N$ were written to the depermutation buffer memory 506 in step 738. In step 744, the deconcatenator 508 extracts soft-decision bits from the codeword segments $750_1$-$750_N$. In step 746, the deconcatenator 508 sequentially communicates the extracted soft-decision bits to an optional router 510. In step 748, the optional router 510 forwards the extracted soft-decision bits to the inner decoding engines $202_1$-$202_N$, respectively. After step 748, step 750 is performed where the method 700 returns to step 708.

If "M" iterations have been performed (732: YES), then step 752 is performed where the processed information bits are communicated to an output buffer memory 112 for storage. Thereafter, step 754 is performed where the method 700 ends.

A person skilled in the art will appreciate that the method 700 is one embodiment of a method for serial concatenated convolutional decoding. However, the invention is not limited in this regard and any other method for serial concatenated convolutional decoding can be used without limitation, provided that it is fast and area efficient The invention described and claimed herein is not to he limited in scope by the preferred embodiments herein disclosed, since these embodiments are intended as illustrations of several aspects of the invention. Any equivalent embodiments are intended to be within the scope of this invention. Indeed, various modifications of the invention in addition to those shown and described herein will become apparent to those skilled in the art, from the foregoing description. Such modifications are also intended to fall within the scope of the appended claims.

We claim:

1. A serial concatenated convolutional code decoder, comprising:
   at least one processing loop module comprising a permutation module, an inner decoder module, a depermutation module, and an outer decoder module; and
   wherein said inner decoder module is subdivided into a plurality of inner decoding engines configured for concurrently performing a decoding operation based on an inner convolutional code
   means for communicating each of a plurality of codeblock segments comprising a different selected portion of a codeblock, in parallel, to a respective one of said plurality of inner decoding engines;
   wherein each of said plurality of codeblock segments is comprised of at least one overlap bit portion and a non-overlap bit portion, said overlap bit portion comprising soft-decision bits included within two or more codeblock segments, and said non-overlap bits portion comprising soft-decision bits included within a single codeblock segment.

2. The serial concatenated convolutional code decoder according to claim 1, wherein said outer decoder module is subdivided into a plurality of outer decoding engines configured for concurrently performing a decoding operation based on an outer convolutional code.

3. The serial concatenated convolutional code decoder according to claim 2, wherein at least one of said inner convolutional code and said outer convolutional code is designed in accordance with a maximum aposteriori probability based decoding algorithm.

4. The serial concatenated convolutional code decoder according to claim 2, wherein said depermutation module is configured for extracting a plurality of soft-decision bits from a plurality of codeword segments and for sequentially communicating said plurality of soft-decision bits to said plurality of outer decoding engines, respectively.

5. The serial concatenated convolutional code decoder according to claim 4, wherein each of said plurality of outer decoding engines is configured for concurrently processing a respective one of said plurality of soft-decision bits.

6. The serial concatenated convolutional code decoder according to claim 5, wherein said plurality of outer decoding engines are configured for simultaneously communicating a plurality of processed soft-decision bits to said permutation module.

7. The serial concatenated convolutional code decoder according to claim 1, further comprising an input buffer memory coupled to said means for communicating and configured for storing soft-decision bits in a codeblock format.

8. The serial concatenated convolutional code decoder according to claim 7, wherein said soft-decision bits result from encoding, prior to being stored in said input buffer memory, using a forward error correction encoding technique based on a series of convolution codes, separated by a permutation step.

9. The serial concatenated convolutional code decoder according to claim 1, wherein each of said plurality of inner decoding engines is configured for concurrently processing one of said plurality of codeblock segments.

10. The serial concatenated convolutional code decoder according to claim 9, wherein said plurality of inner decoding engines are configured for communicating a plurality of processed codeblock segments to said depermutation module in a clock cycle by clock cycle, bit by bit manner.

11. The serial concatenated convolutional code decoder according to claim 1, wherein said serial concatenated convolutional code decoder is comprised of a field programmable gate array or an application specific integrated circuit.

12. A serial concatenated convolutional code decoder, comprising:
   at least one processing loop module comprising a permutation module, an inner decoder module, a depermutation module, and an outer decoder module; and
   wherein said inner decoder module is subdivided into a plurality of inner decoding engines configured for concurrently performing a decoding operation based on an inner convolutional code, and said outer decoder module is subdivided into a plurality of outer decoding engines configured for concurrently performing a decoding operation based on an outer convolutional code;
   means for communicating each of a plurality of codeblock segments comprising a different selected portion of a codeblock, in parallel, to a respective one of said plurality of inner decoding engines;
   wherein each of said plurality of codeblock segments is comprised of at least one overlap bit portion and a non-overlap bit portion, said overlap bit portion comprising soft-decision bits included within two or more codeblock segments, and said non-overlap bits portion comprising soft-decision bits included within a single codeblock segment.

13. The serial concatenated convolutional code decoder according to claim 12, further comprising an input buffer memory coupled to said means for communicating and configured for storing soft-decision bits in a codeblock format.

14. The serial concatenated convolutional code decoder according to claim 13, wherein each of said plurality of inner decoding engines is configured for concurrently processing one of said plurality of codeblock segments.

15. The serial concatenated convolutional code decoder according to claim 14, wherein said plurality of inner decoding engines are configured for communicating a plurality of processed codeblock segments to said depermutation module in a clock cycle by clock cycle, bit by bit manner.

16. The serial concatenated convolutional code decoder according to claim 12, wherein said depermutation module is configured for extracting a plurality of soft-decision bits from a plurality of codeword segments and for sequentially communicating said plurality of soft-decision bits to said plurality of outer decoding engines, respectively.

17. The serial concatenated convolutional code decoder according to claim 16, wherein each of said plurality of outer decoding engines is configured for concurrently processing a respective one of said plurality of soft-decision bits.

18. The serial concatenated convolutional code decoder according to claim 17, wherein said plurality of outer decoding engines are configured for simultaneously communicating a plurality of processed soft-decision bits to said permutation module.

19. A method for serial concatenated convolutional decoding, comprising;
   receiving a codeblock at an input buffer memory of a serial concatenated convolutional code decoder;
   separating said codeblock into a plurality of codeblock segments, each comprised of at least one overlap bit portion and a non-overlap bit portion, said overlap bit portion comprising soft-decision bits included within two or more codeblock segments, and said non-overlap bit portion comprising soft-decision bits included within a single codeblock segment;
   concurrently communicating each of said plurality of codeblock segments to a respective one of a plurality of inner decoding engines;

concurrently processing in said plurality of inner decoding engines the respective soft-decision bits associated with each of said plurality of codeblock segments to generate at least one soft-decision bit from each of the plurality of inner decoding engines;

concatenating a set of said soft-decision bits generated by said plurality of inner decoding engines to form a codeword segment; and writing said codeword segment to a depermutation buffer memory.

20. The method according to claim 19, further comprising repeating said processing, concatenating, and writing steps to respectively generate and store a plurality of codeword segments in said depermutation buffer memory.

21. The method according to claim 20, further comprising depermuting said plurality of codeword segments and extracting soft-decision bits from said plurality of codeword segments for a plurality of outer decoding engines.

22. The method according to claim 21, further comprising communicating said soft-decision bits extracted from said codeword segments to said plurality of outer decoding engines.

23. The method according to claim 22, further comprising concurrently processing said soft-decision bits extracted from said plurality of codeword segments in said plurality of outer decoding engines to generate at least one soft-decision bit from each of said plurality of outer decoding engines.

24. The method according to claim 23, further comprising concatenating a set of said soft-decision bits generated by said plurality of outer decoding engines to form a codeword segment.

25. The method according to claim 24, further comprising writing said codeword segment to a permutation buffer memory.

26. The method according to claim 25, further comprising repeating said processing, concatenating, and writing steps to respectively generate and store a plurality of codeword segments in said permutation buffer memory.

27. The method according to claim 26, further comprising permuting said codeword segments stored in said permutation buffer memory and extracting soft-decision bits from said codeword segments for said plurality of inner decoding engines.

* * * * *